United States Patent
Hales

(10) Patent No.: US 6,932,446 B2
(45) Date of Patent: Aug. 23, 2005

(54) EXTENSION CABINET FOR ELECTRICAL SYSTEMS AND METHOD

(76) Inventor: Robert J. Hales, 405 N. Reo St., Tampa, FL (US) 33609

( * ) Notice: Subject to any disclaimer, the term of this patent is extended or adjusted under 35 U.S.C. 154(b) by 0 days.

(21) Appl. No.: 10/328,894

(22) Filed: Dec. 23, 2002

(65) Prior Publication Data

US 2003/0168949 A1 Sep. 11, 2003

Related U.S. Application Data

(60) Provisional application No. 60/344,517, filed on Dec. 28, 2001.

(51) Int. Cl.[7] .............................................. A47B 97/00
(52) U.S. Cl. ..................... 312/223.1; 312/198; 312/310
(58) Field of Search ................................ 312/107, 198, 312/263, 223.1, 265.5, 265.6, 205, 310

(56) References Cited

U.S. PATENT DOCUMENTS

| 4,466,049 A | * | 8/1984 | Chaney et al. .............. 361/802 |
| 4,699,270 A | * | 10/1987 | Bohm ......................... 312/107 |
| 5,282,114 A | * | 1/1994 | Stone .......................... 361/695 |
| 5,451,794 A | * | 9/1995 | McKeown et al. ....... 250/492.3 |
| 5,467,250 A | * | 11/1995 | Howard et al. ............. 361/701 |
| 6,061,966 A | * | 5/2000 | Nelson et al. ........... 312/223.1 |
| 6,195,493 B1 | * | 2/2001 | Bridges ...................... 385/134 |

FOREIGN PATENT DOCUMENTS

| EP | 0441271 | * | 8/1991 |
| WO | 9407391 | * | 4/1994 |

* cited by examiner

Primary Examiner—Lanna Mai
Assistant Examiner—Hanh V. Tran
(74) Attorney, Agent, or Firm—Ruden McClosky; Stanley A. Kim, Esq.

(57) ABSTRACT

An extension device for an electrical cabinet includes a plurality of panel members, an access port in a first panel member of the plurality of panel members, a top engaging the plurality of panel members, and wherein the plurality of panel members is connected and defines a functional area.

3 Claims, 6 Drawing Sheets

EXTENSION CABINET FOR ELECTRICAL SYSTEMS AND METHOD

CROSS REFERENCE TO RELATED APPLICATIONS

This application claims the benefit of U.S. Provisional Application Ser. No. 60/344,517, filed on Dec. 28, 2001, entitled EXTENSION CABINET FOR ELECTRICAL SYSTEMS AND METHOD.

TECHNICAL FIELD

The present invention relates generally to equipment cabinets. In particular, the present invention relates to an electrical cabinet used as an extension for pre-existing cabinets for electrical systems.

BACKGROUND OF THE INVENTION

As is known in the art, electrical cabinets are used to house an array of electrical components, such as telecommunications equipment and related components. An electrical cabinet permits components housed within the cabinet to be interconnected and also allows components within the cabinet to be connected to components outside the cabinet. The components housed within the cabinet often maintain or control telecommunications systems.

Typically, these types of cabinets are utilized in electrical technology. Generally, the frame of such a cabinet supports wires, cables, modules, as well as various other types of built-in and inserted components and forms the supporting structure for the cabinet. Typically, the housing of the cabinet is completed through the introduction of wall elements and a door. The housing visually contains the contents of the cabinet, effects mechanical protection and, if necessary, electromagnetic shielding.

Typically, administrators and technicians of a telecommunications systems contained within an electrical cabinet require regular access to components housed within the cabinet. The administrators desire such access to increase their ability to monitor a system's functions and/or to exert control over the housed system, while technicians desire such access to conduct repairs to the housed system.

When an electrical cabinet is assembled, components may be installed to provide administrators and technicians with access to monitor a system's functions and/or to exert control or repairs over the systems housed in such cabinet. However, current installation techniques are labor intensive, often including the attachment or machining of several parts. Therefore, to reduce costs, the cabinets are typically constructed as compactly as possible.

Moreover, due to the compact size of the cabinets for telecommunications systems, the access provided to components within electrical cabinets is inconvenient for the type of access desired. Current cabinets fail to provide quick and convenient regular access to stored components within electrical cabinets for telecommunications equipment and systems, since the compact size of current electrical cabinets tightly packs such equipment and systems.

An electrical cabinet of the type mentioned above is generally located outdoors, and typically provides some degree of protection for the telecommunications equipment and systems housed in the cabinet against inclement weather and outside interventions. Their use is increasingly frequent, and it is therefore necessary to reduce their implementation cost while preserving their protective and tamper-proof qualities.

Equipment cabinets for accommodating electronic components must meet a number of requirements as well. For example, these cabinets must have a high degree of mechanical strength, particularly with respect to stresses and during inclement weather, such as occurs during hurricanes, seismic disturbances, and the like. Furthermore, the required degree of accessibility for the housed components requires casing components that not only provide protection against dust and water but also against electromagnetic radiation.

In operation, electronic systems generate electrical signals in the form of radio frequency waves or electromagnetic radiation or both. If not properly shielded, these signals can interfere with the operation of unrelated equipment. Radio frequency interference ("RFI") is interference from sources of energy outside of an electrical system. Electromagnetic interference ("EMI") is interference, generally at radio frequencies, generated within the electrical system itself. To prevent EMI/RFI interference, governmental regulations and industry standards require that the sources of radio frequency or electromagnetic radiation within a system be shielded.

Additionally, sensitive electronic components must also be protected from more tangible forms of disruption. Other sources of disruption to the operation of electronics systems are moisture and foreign particles, such as dust. The presence of a substantial amount of either of these can corrode or otherwise impede electrical contacts.

In view of the high cost of initial acquisition and installation, there is a need to provide an extension cabinet for existing electrical cabinets for telecommunications equipment and systems that permits existing electrical cabinets to be modified and/or converted at minimum expense and effort, and that further includes the properties of existing electrical cabinets.

SUMMARY OF THE INVENTION

The present invention eliminates the above-mentioned needs for an extension cabinet for existing electrical cabinets for telecommunications equipment and systems by providing an extension cabinet and a method of extending an electrical cabinet.

In accordance with the present invention, there is provided a method of extending an electrical cabinet including the steps of creating an opening in the electrical cabinet to provide access to an internal area, positioning an extension device having an access port adjacent to the electrical cabinet, aligning the access port and the opening in a spatial arrangement, and securing the extension device to the electrical cabinet.

The present invention is further directed to an extension device for an electrical cabinet comprising a plurality of panel members, an access port in a first panel member of the plurality of panel members, a top engaging the plurality of panel members, and wherein the plurality of panel members are connected and define a functional area.

The present invention is additionally directed to an extension device for an electrical cabinet comprising a back member having an access port for accessing the electrical cabinet, at least one side member connected to the back member, a top member engaging the back member and the side member, and wherein the back member and the side member define a functional area.

The present invention is still further directed to an extension device for an electrical cabinet comprising a back member having an access port for accessing the electrical cabinet, a first side member connected to the back member, a second side member connected to the back member, a top engaging the back member, first side member, and second side member, and wherein the back member, first side member, and second side member define a functional area.

DETAILED DESCRIPTION OF THE INVENTION

Figure 1:
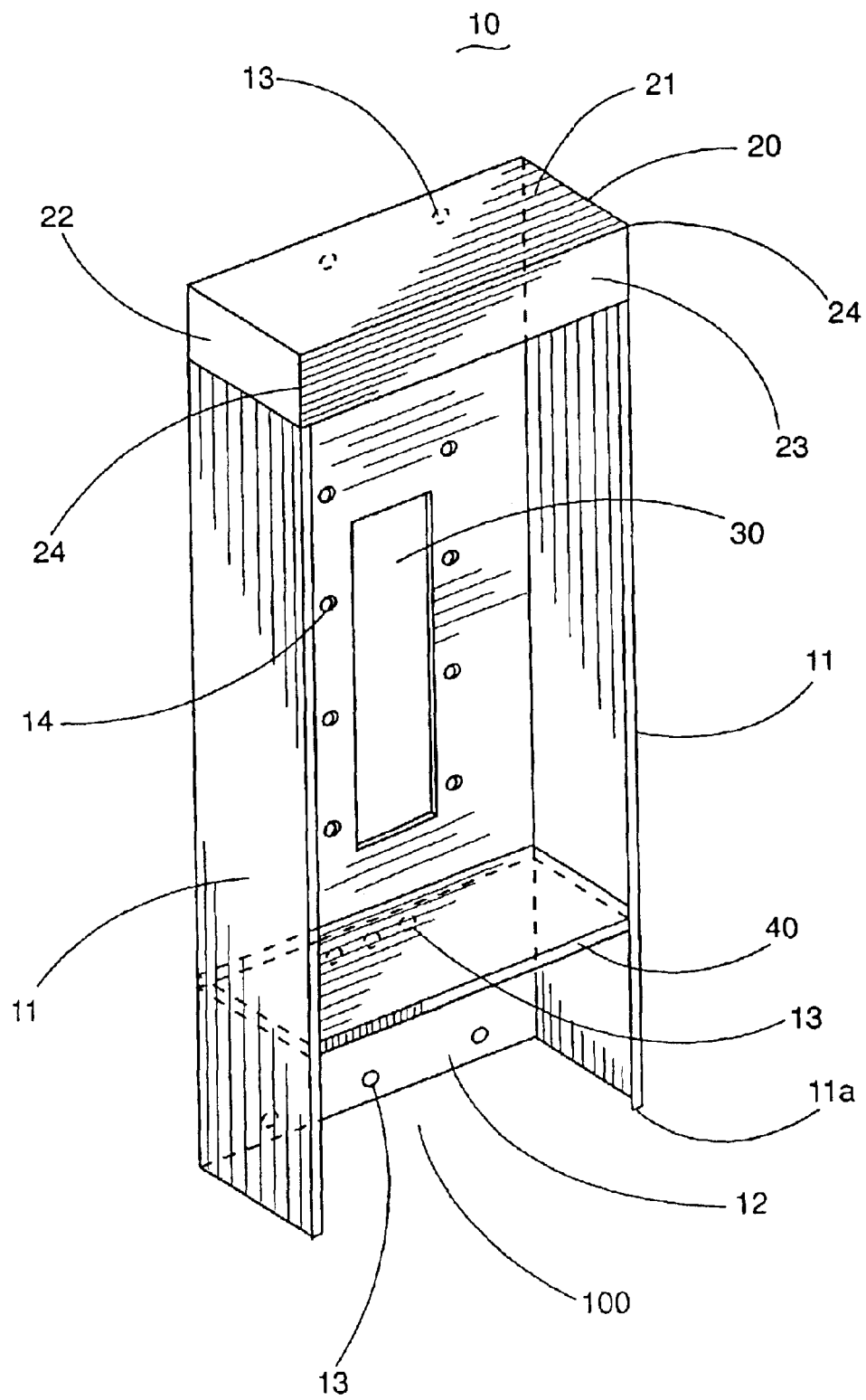
FIG. 1 is a three-quarters view illustration of the preferred embodiment of the present invention.

Referring now to FIG. 1, a preferred embodiment of the present invention is illustrated as electrical cabinet extension 10. Electrical cabinet extension 10 includes a plurality of panel members 11 that further includes a first panel member 12, an access port 30 in first panel member 12, and a top 20 engaging plurality of panel members 11.

Figure 5:
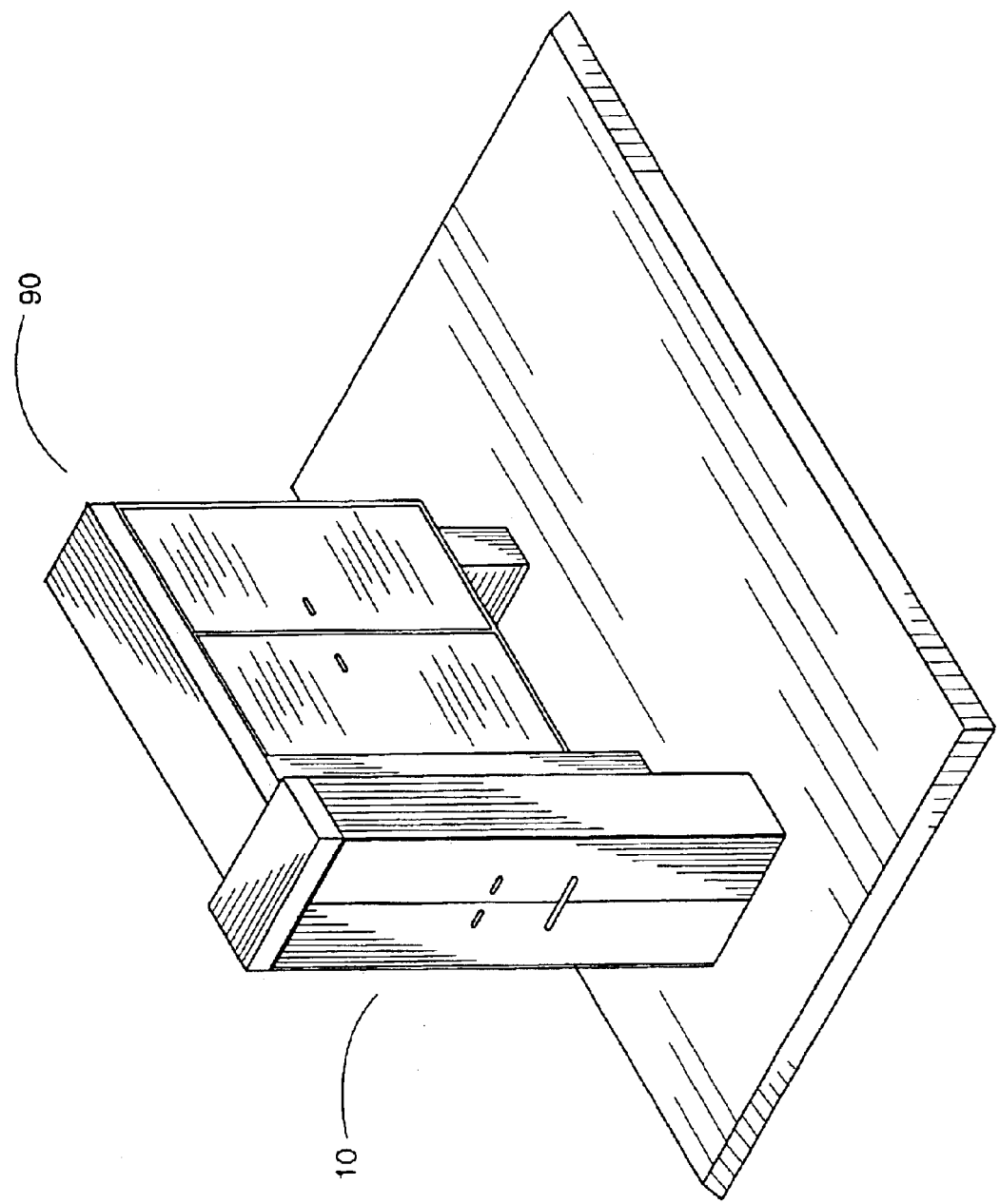
FIG. 5 is a three-quarters view illustration of the preferred embodiment of the present invention of FIG. 4 in use with a typical electrical cabinet.

In the preferred embodiment of the present invention, plurality of panel members 11 is connected and defines a functional area 100. After an opening in the existing electrical cabinet is created, first panel member 12 is positioned adjacent to the opening. Access port 30 in first panel member 12 is aligned, as shown in FIG. 5, with an opening in electrical cabinet 90. After access port 30 is aligned with the opening created in electrical cabinet 90, electrical cabinet extension 10 is secured to electrical cabinet 90.

Electrical cabinet extension 10 is secured to electrical cabinet 90 at mounting holes 13 and fastener holes 14. Mounting holes 13 allow fastening means (not shown), such as screws, bolts, and the like, to affix electrical cabinet extension 10 to electrical cabinet 90. The fastening means allow for a more permanent securement to electrical cabinet 90. Upon aligning access port 30 with the opening in electrical cabinet 90, electrical cabinet extension 10 is affixed to electrical cabinet 90. Placing fastening means through fastener holes 14 and into electrical cabinet 90 stabilizes the alignment of access port 30 with the opening in electrical cabinet 90. The stabilized alignment between access port 30 and the opening in electrical cabinet 90 permits a portion of the contents of electrical cabinet 90 to drawn into electrical cabinet extension 10 through access port 30 of first panel member 12 of plurality of panel members 11.

In the preferred embodiment of the present invention, plurality of panel members 11 may be formed from a single piece of material or may be formed from several pieces of material that are joined. Panel members 11 include lips 11a. Lips 11a provide attachment points for shelf support 40 and additionally offer a degree of stability for the electrical cabinet extension 10 as well as further securement positions for top 20.

Top 20 may be formed from a portion of the material that forms plurality of panel members 11. Top 20 may also be formed from material separate from the material that forms plurality of panel members 11. Top 20 includes top member 21, top side members 22, and top front member 23. Top member 21 functions as a covering for electrical cabinet extension 10, thereby affording protection to components placed within functional area 100. Top member 21, top side members 22, and top front member 23 may be formed from a single piece of material without interruptions or breaks at their intersecting edges 24. Alternatively, top member 21, top side members 22, and top front member 23 may be formed from a single piece of material with interruptions or breaks at their intersecting edges 24. In this situation, intersecting edges 24 are joined through a process such as welding or other similar joining process.

Figure 2:
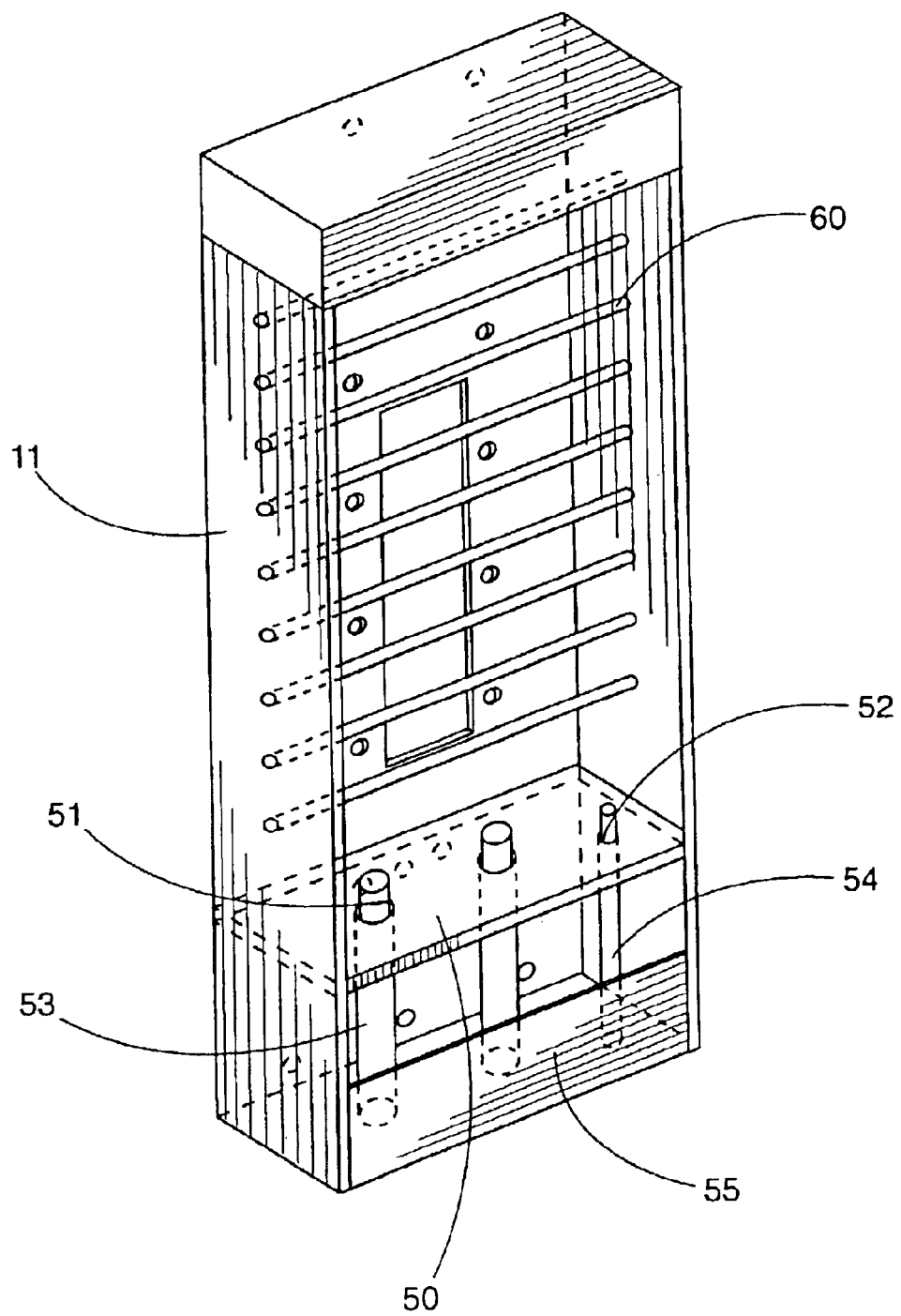
FIG. 2 is a three-quarters view illustration with additional components of the preferred embodiment of the present invention of FIG. 1.

As illustrated in FIG. 2, the preferred embodiment of the present invention further includes shelf 50, retaining member 55, and crossmembers 60. Shelf 50 is supported by shelf support 40, and may be attached to shelf support 40 by processes such as welding or other similar attachment processes. Shelf 50 additionally incorporates large shelf support holes 51 and small shelf support holes 52. Large shelf support hole 51 provides an opening through which electrical cabinet extension support structure 53 extends. Electrical cabinet extension support structure 53 engages the substrate on which electrical cabinet extension 10 resides and functions as a mount for electrical cabinet extension 10 to the substrate. Electrical cabinet extension support structure 53 may be hollow, solid, or filled with a material, such as concrete. Small shelf support hole 52 provides an opening through which electrical cabinet extension small structure 54 extends. Electrical cabinet extension small structure 54 may function as a drainage structure for ensuring excess moisture does not collect in electrical cabinet extension 10.

Both electrical cabinet extension support structure 53 and electrical cabinet extension small structure 54 are provided with supplementary support through the addition of support material (not shown). This support material may include rocks, gravel, foam, or other material that has sufficiently cleaned so as to diminish particulate matter that may harm the components in the functional area. The support material additionally functions as drainage and filtering means.

The support material is contained by plurality of panel members 11 and by retaining member 55. Retaining member 55 engages lips 11a, where it is secured into position. Retaining member 55 prevents the support material from excessively moving.

Further support for electrical cabinet extension 10 is provided by crossmembers 60. Crossmembers 60 extend transversely across functional area 100, each end of crossmembers 60 engaging a side member 11. In doing so, crossmembers 60 provide stability and torsional support to electrical cabinet extension 10.

Figure 3:
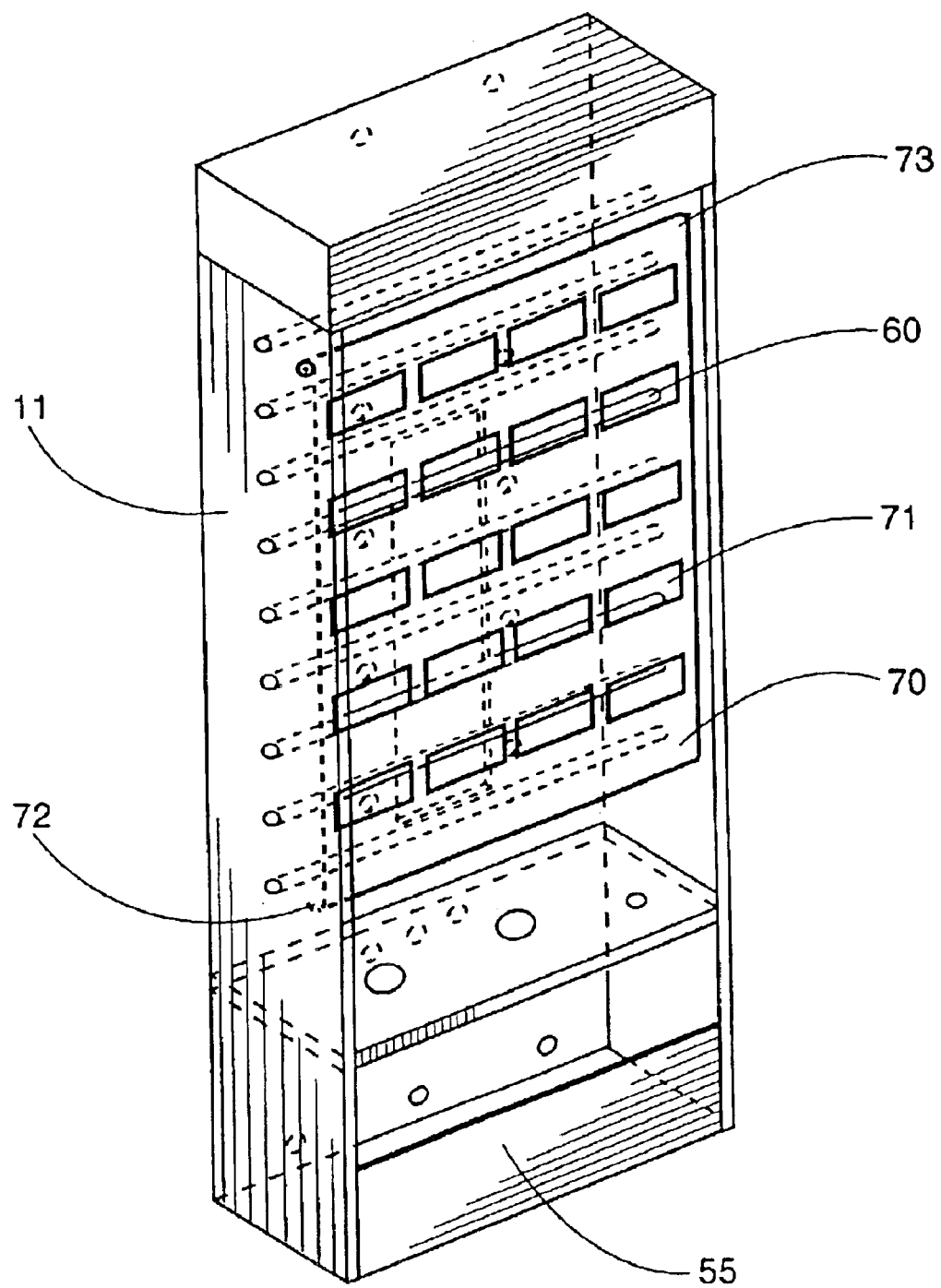
FIG. 3 is a three-quarters view illustration with further additional components of the preferred embodiment of the present invention of FIG. 2.

As shown in FIG. 3, electrical cabinet extension 10 may additionally include access panel 70. Access panel 70 protects the components that are brought into functional area 100. Moreover, access panel 70 may act as a barrier to the components in functional area 100, thus preventing a user from unintentional contact with the components.

Access panel 70 includes spaces 71, hinging means 72, and securing means 73. Spaces 71 allow for heat to dissipate, reducing the potential for a heat-damaging incident. Moreover, spaces 71 permit the user to visually confirm the position of the components in functional area 100 prior to engaging access panel 70. Access panel 70 is positioned by hinging means 72. Hinging means 72 is mounted to access panel 70, and is any one of a number of hinges known in the art. Hinging means 72 engages panel members 11, so as to provide rotation points that allow a user to pivot or swing access panel 70 to a position that permits access to functional area 100.

Additionally, in the preferred embodiment, access panel 70 is secured in position by securing means 73. Securing means 73 may include sliding pins, spring-loaded mechanisms, locks, or the like. The user engages securing means 73 to either release access panel 70 from its resting position, or to secure access panel 70 into its resting position.

Figure 4:
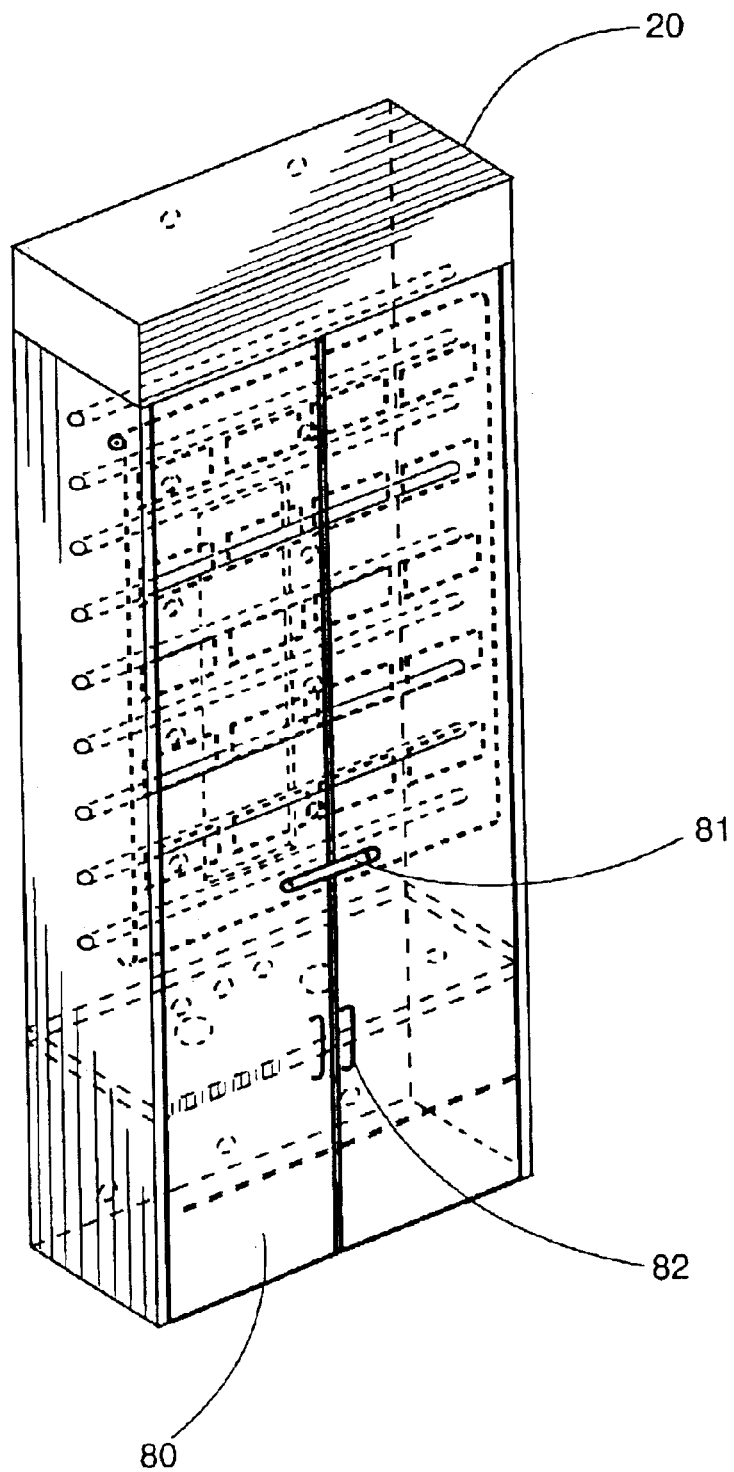
FIG. 4 is a three-quarters view illustration with additional components of the preferred embodiment of the present invention of FIG. 3.

As illustrated in FIG. 4, the preferred embodiment of the present invention includes at least one door 80. Door 80 provides security from the elements, as well as from undesired users, and includes handle 81 and lock supporting member 82. Handle 81 assists the user in opening door 80 and subsequently accessing functional area 100. Lock supporting member 82 allows the user to further secure electrical cabinet extension 10 any one of a vast array of known locks. Door 80 is operatively engaged to electrical cabinet extension 10 in a conventional manner as is well known in the art.

Figure 6:
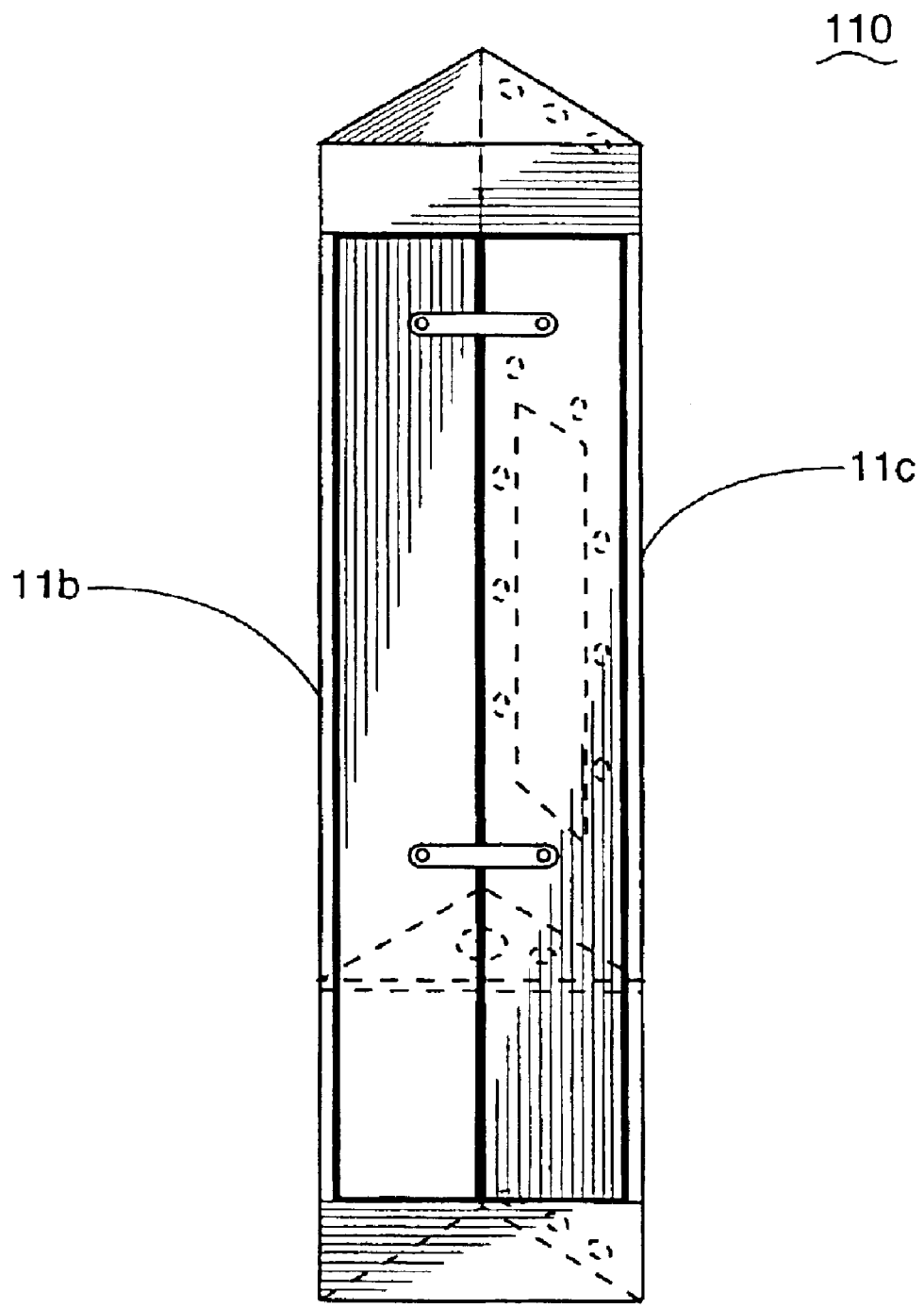
FIG. 6 is a three-quarters view of an alternate embodiment of the present invention of FIG. 1.

An alternative embodiment of the present invention is illustrated in FIG. 6. FIG. 6 shows an electrical cabinet extension 110 having sides 11*b* and 11*c*, but functioning in a similar fashion to the preferred embodiment.

In practicing the method of the preferred embodiment, an opening is created in electrical cabinet 90 (shown in FIG. 5). This opening provides access to an internal area of electrical cabinet 90. Electrical cabinet extension 10 is positioned adjacent to electrical cabinet 90, in a manner that results in the alignment of the opening with access port 30 in a spatial arrangement. The spatial arrangement is such that access port 30 and the opening in electrical cabinet 90 can be readily fastened together. Electrical cabinet extension 10 and electrical cabinet 90 are thus secured to one another, as is shown in FIG. 5. Components from electrical cabinet 90, such as wires, are drawn into functional area 100 of electrical cabinet extension 10. By relocating components into functional area 100 from electrical cabinet 90, a user can more easily work with such components. Moreover, the additional space permits heat generated by the components to dissipate more readily.

Although only a few exemplary embodiments of the present invention have been described in detail above, those skilled in the art will readily appreciate that numerous modifications are to the exemplary embodiments are possible without materially departing from the novel teachings and advantages of this invention. Accordingly, all such modifications are intended to be included within the scope of this invention as defined in the following claims.

What is claimed is:

1. An extension device for an electrical cabinet comprising:
   a plurality of panel members;
   an access port in a first panel member of said plurality of panel members, wherein said access port provides access to said electrical cabinet and wherein said plurality of panel members is interconnected and defines a functional area;
   a top engaging said plurality of panel members;
   an access panel positioned internal to said functional area and movable between a resting position and a non-resting position, said access panel having openings for dissipating heat; and
   at least one door enclosing the functional area, the door being positionable between an open position and a closed position, wherein the access panel in its resting position is substantially parallel to the at least one door when the at least one door is in its closed position, and the access panel in its non-resting position permits access to the functional area.

2. The extension device according to claim 1 wherein said top is formed from a panel member of said plurality of panel members.

3. The extension device according to claim 1 wherein at least one cross member engages at least one panel member of said plurality of panel members.

* * * * *